United States Patent
Lee

(10) Patent No.: US 6,380,013 B2
(45) Date of Patent: Apr. 30, 2002

(54) METHOD FOR FORMING SEMICONDUCTOR DEVICE HAVING EPITAXIAL CHANNEL LAYER USING LASER TREATMENT

(75) Inventor: Jung-Ho Lee, Kyoungki-do (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/887,288

(22) Filed: Jun. 22, 2001

(30) Foreign Application Priority Data

Jun. 28, 2000 (KR) .......................... 2000-35996

(51) Int. Cl.$^7$ ............................................. H01L 21/337
(52) U.S. Cl. ........................ 438/184; 438/199; 438/217
(58) Field of Search .................................. 438/199, 162, 438/528, 595, 217, 275, 276, 289, 200, 184; 257/339, 402

(56) References Cited

U.S. PATENT DOCUMENTS

| | | | |
|---|---|---|---|
| RE28,704 E | * 2/1976 | Robinson et al. | ........... 257/392 |
| 5,151,759 A | * 9/1992 | Vinal | ........................ 257/348 |
| 5,770,485 A | * 6/1998 | Gardner et al. | ............. 438/162 |
| 6,312,981 B1 | * 11/2001 | Akamatsu et al. | .......... 438/217 |
| 6,337,248 B1 | * 1/2002 | Imai | ............................. 438/199 |
| 2001/0025997 A1 | * 10/2001 | Onishi | ........................ 257/402 |
| 2002/0001890 A1 | * 1/2002 | Lee | ............................. 438/184 |

* cited by examiner

Primary Examiner—Michael S. Lebentritt
(74) Attorney, Agent, or Firm—Marshall, Gerstein, & Borun.

(57) ABSTRACT

A method for fabricating a semiconductor device, and, more particularly, a method for fabricating a transistor using an epitaxial channel and a laser thermal treatment is disclosed. The method for forming a semiconductor device includes the steps of: forming a delta doping layer having impurity ions on a semiconductor substrate with a low energy ion-implantation; activating the impurity ions within the delta doping layer by thermally treating a surface of the semiconductor substrate with a laser; forming a channel epitaxial layer on the semiconductor substrate; forming a gate insulation layer and a gate electrode on the channel epitaxial layer in this order; and forming a source/drain region in the semiconductor substrate. Improved current drivability of the semiconductor device is achieved by an increase in the ion activity to adjust the threshold voltage. The delta doping effect through the low energy ion-implantation is maximized.

20 Claims, 4 Drawing Sheets

METHOD FOR FORMING SEMICONDUCTOR DEVICE HAVING EPITAXIAL CHANNEL LAYER USING LASER TREATMENT

FIELD OF THE INVENTION

The present invention relates to a method for fabricating a semiconductor device; and, more particularly, to a method for fabricating a transistor using an epitaxial channel and a laser thermal treatment.

DESCRIPTION OF PRIOR ART

Recently, low energy ion-implantation and epitaxial channel processes have been considered as a technique to form highly integrated circuits having a line width of 0.1 μm or less because these processes may improve the short channel effect (SCE) at a low threshold voltage.

FIG. 1 is a cross-sectional view illustrating a method for forming a conventional semiconductor device. As shown in FIG. 1, a channel ion-implantation layer 12 and an epitaxial silicon layer 13 are formed on a semiconductor substrate 11 in this order. Accordingly, to guarantee the quality of the semiconductor device, at least two conditions should be satisfied. First, a profile of the implanted boron ions should be maintained over the epitaxial growing process and the following thermal treatments. Second, since the epitaxial silicon layer 13 is used as a channel, a high-quality epitaxial layer should grow without any interfacial boundary between the epitaxial silicon layer 13 and the semiconductor substrate 11.

However, as of now, the doping profile of the boron ions deteriorates at a temperature of 800° C. for the following epitaxial growing and a rapid thermal processing (RTP) at 950° C. for about 20 seconds. Also, since the epitaxial silicon layer grows on the semiconductor substrate into which the impurities are implanted, the impurities, such as oxygen, may form a layer between the epitaxial silicon layer and the semiconductor substrate. Such a layer may damage the physical characteristics of the epitaxial channel.

SUMMARY OF THE DISCLOSURE

A method for forming electrically stable semiconductor device by thermally treating a semiconductor substrate with a laser is disclosed.

A method for forming a thin semiconductor device having a decreased tunneling leakage current is also disclosed.

A method for forming a semiconductor device is disclosed which comprises the steps of: forming a delta doping layer having impurity ions on a semiconductor substrate with a low energy ion-implantation; activating the impurity ions within the delta doping layer by thermally treating a surface of the semiconductor substrate with a laser; forming a channel epitaxial layer on the semiconductor substrate; forming a gate insulation layer and a gate electrode on the channel epitaxial layer in this order; and forming a source/drain region in the semiconductor substrate.

DETAILED DESCRIPTION OF THE PRESENTLY PREFERRED EMBODIMENTS

Hereinafter, the present invention will be described in detail referring to the accompanying drawings.

Figure 1:
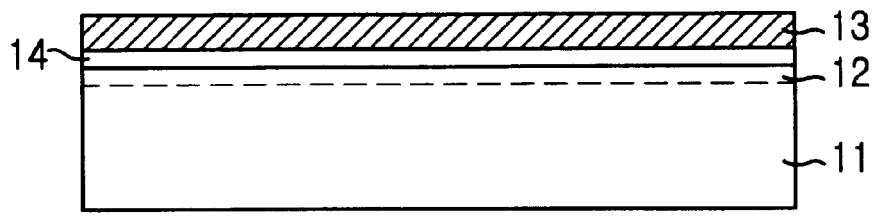
FIG. 1 is a cross-sectional view illustrating a method for forming a conventional semiconductor device.
Figure 2A:
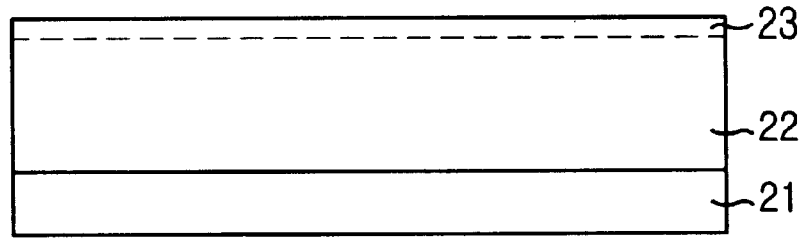
FIGS. 2A to 2D are cross-sectional views illustrating one disclosed method for forming a semiconductor device.

Referring to FIG. 2A, a field oxide layer (not shown) is formed in a semiconductor substrate 21. An ion implantation for forming a well 22 is carried out by implanting impurity ions into the exposed semiconductor substrate 21 and the RTP is carried out at a temperature of approximately 950° C. for a few seconds in order to activate the implanted ions. After a screen oxide layer (not shown) is formed on the semiconductor substrate 21 to prevent the semiconductor substrate 21 from being damaged by the following high-energy ion implantation, a delta doping layer 23 is formed by implanting channel ions to adjust the threshold voltage into the semiconductor substrate 21 and the screen oxide layer is removed. At this time, in the ion implantation for adjusting the threshold voltage, the acceleration energy is low and then the implantation depth is very shallow on the semiconductor substrate 21. Boron or BF2 ions, as channel ions, may be used. In the case of boron ions, a dose for the implantation may range from about $1 \times 10^{12}$ to about $5 \times 10^{13}$ atms/cm$^2$ at 0.1 keV to about 5 keV and, in the case of $BF_2$ ions, a dose for the implantation may range from about $1 \times 10^{12}$ to about $5 \times 10^{13}$ atms/cm$^2$ at a voltage ranging from about 0.5 keV to about 52 keV.

Figure 2B:
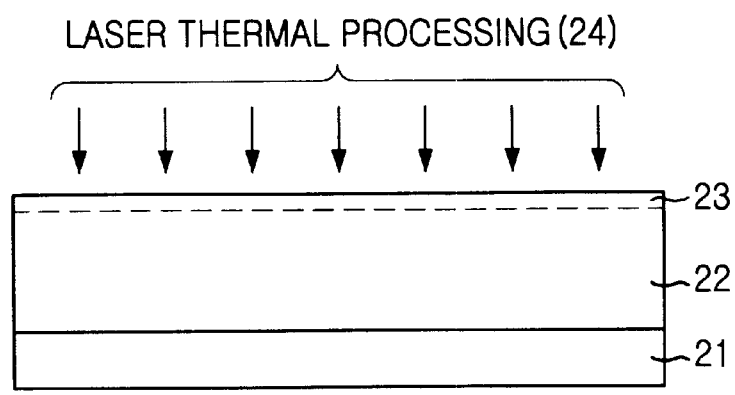

Referring to FIG. 2B, after performing the channel ion-implantation process, a laser thermal processing (LTP) 24 is applied to the semiconductor substrate 21. In the LTP, a surface of the semiconductor substrate 21 is melted and instantaneously thereafter re-crystallized. The ions in the surface of the semiconductor substrate 21, which has been treated by the LTP, are not diffused throughout the semiconductor substrate 21 in the following processes, but uniformly distributed. That is, since the ions hardly diffuse, more activated ions may be obtained. Further, the ions in a region, which is treated by the LTP, are suppressed in the following thermal treatments so that the preferred doping profile (Super Steep Retrograde; SSR) is maintained after the rapid thermal processing for the epitaxial silicon layer or source/drain region.

In an embodiment, the laser used in the LTP is a 308 nm-XeCl laser and its energy ranges from about 0.1 J/cm$^2$ to about 2 J/cm$^2$. Instantaneously melting and recrystallization of the semiconductor substrate 21 in the LTP remove the impurities contained in the semiconductor substrate 21. Accordingly, it is possible to improve the quality of an epitaxial silicon layer by growing it on the impurity-removed semiconductor substrate 21.

Furthermore, in order to maximize the effect of the LTP, it may be possible to maximize the silicon melting during the LTP by making the surface of the semiconductor substrate 21 amorphous before performing the laser irradiation. In another method, it may be possible to melt the surface of the semiconductor substrate 21 by controlling the power of laser, regardless of the thickness of the amorphous layer.

Figure 2C:
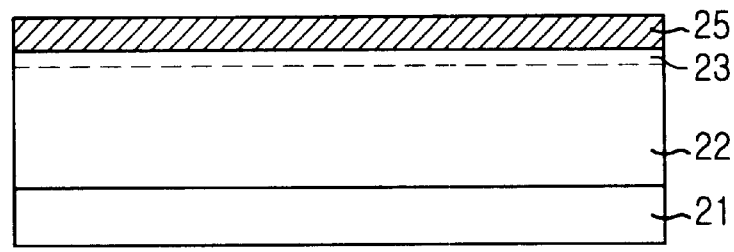

Referring to FIG. 2C, an epitaxial silicon layer 25 for a channel is formed on the semiconductor substrate 21, which has been treated by the LTP, using the selective epitaxial silicon growing method. The epitaxial silicon layer 25, which is an undoped silicon layer, is formed to a thickness ranging from about 100 Å to about 500 Å by a LPCVD (Low Pressure Chemical Vapor Deposition) or a UHV CVD (Ultra High Vacuum Chemical Vapor Deposition) method.

In the case of a LPCVD method, after a hydrogen hardening procedure is applied in-situ to the semiconductor substrate 21 at a temperature ranging from about 800° C. to about 900° C. for a time period ranging from about 1 minute to about 5 minutes, the epitaxial silicon layer 25 is formed by using a gas mixture of dichlorosilane at a flow rate ranging from about 30 sccm to about 300 sccm and HCl at a flow rate ranging from about 30 sccm to about 200 sccm, at a pressure ranging from about 10 torr to about 100 torr and a temperature ranging from about 750° C. to about 950° C., for a time period ranging from about 3 minutes to about 10 minutes. In the case of the UHV CVD, the epitaxial silicon layer 25 is formed by using silane or disilane at a pressure ranging from about 0.01 torr to about 1 torr and a temperature ranging from about 600° C. to about 700° C. As stated above, if an epitaxial layer formed on the semiconductor substrate 21, which is treated by the laser, is used as a channel layer, a junction leakage current may be decreased due to the laser shock.

Figure 2D:
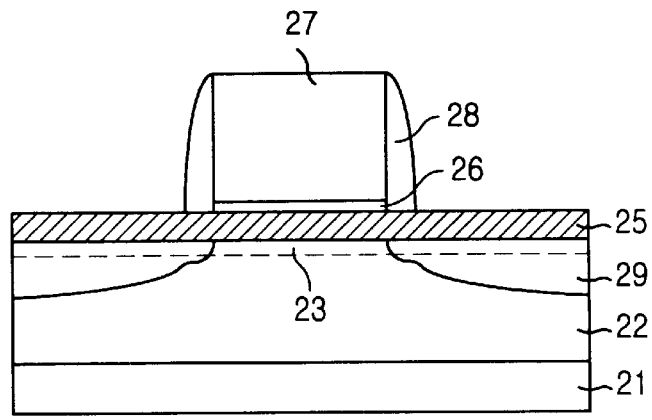

Referring to FIG. 2D, after forming a gate oxide layer 26 and a polysilicon layer on the epitaxial silicon layer 25, a gate electrode 27 is formed by patterning the polysilicon layer and an oxide spacer 28 is formed on the sidewalls of the gate electrode 27. A source/drain 29 is formed on the semiconductor substrate 21 using the gate electrode 27 and an oxide spacer 28 as an ion-implantation mask. In the case where a thermal oxide layer is used as a gate oxide layer and an ultra-thin device is required to have the thermal oxide layer with a thickness of 40 Å or less, a conventional device formed without the above-mentioned laser treatment may not achieve a stable operation because the tunneling leakage current.

However, since the epitaxial silicon layer 25 is formed on the semiconductor substrate 21, in which the impurities such as oxygen are reduced, and thereafter a thermal oxide layer is formed as a gate oxide layer, the tunneling leakage current decreases by up to 50%. Accordingly, in the case where the laser thermal treatment is applied to the semiconductor substrate 21 before the epitaxial silicon layer 25 is formed, the decrease of the leakage current may be maximized by the removal of impurities, such as oxygen.

Figure 3:
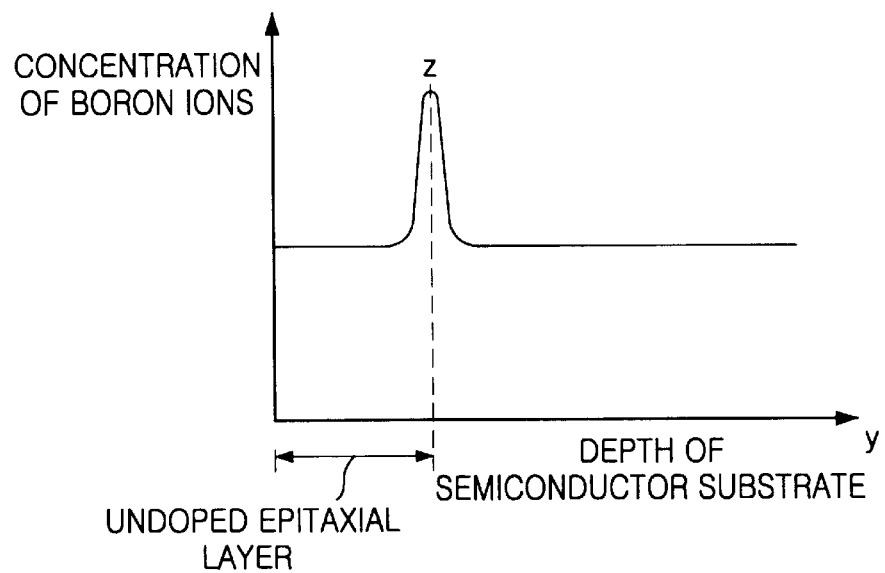
FIG. 3 is a plot illustrating the doping profile of the boron ions according to the disclosed method.

FIG. 3 is a plot showing the doping profile of the boron ions according to the present invention. As shown in FIG. 3, a sharp doping profile is maintained at a specific depth after the thermal treatment for forming the epitaxial silicon layer 25 and the source/drain 29. That is, the delta doping layer 23 maintains such a sharp doping profile (Z) at a specific depth, the thickness (X) of the epitaxial silicon layer 25, by performing the laser treatment.

Figure 4:
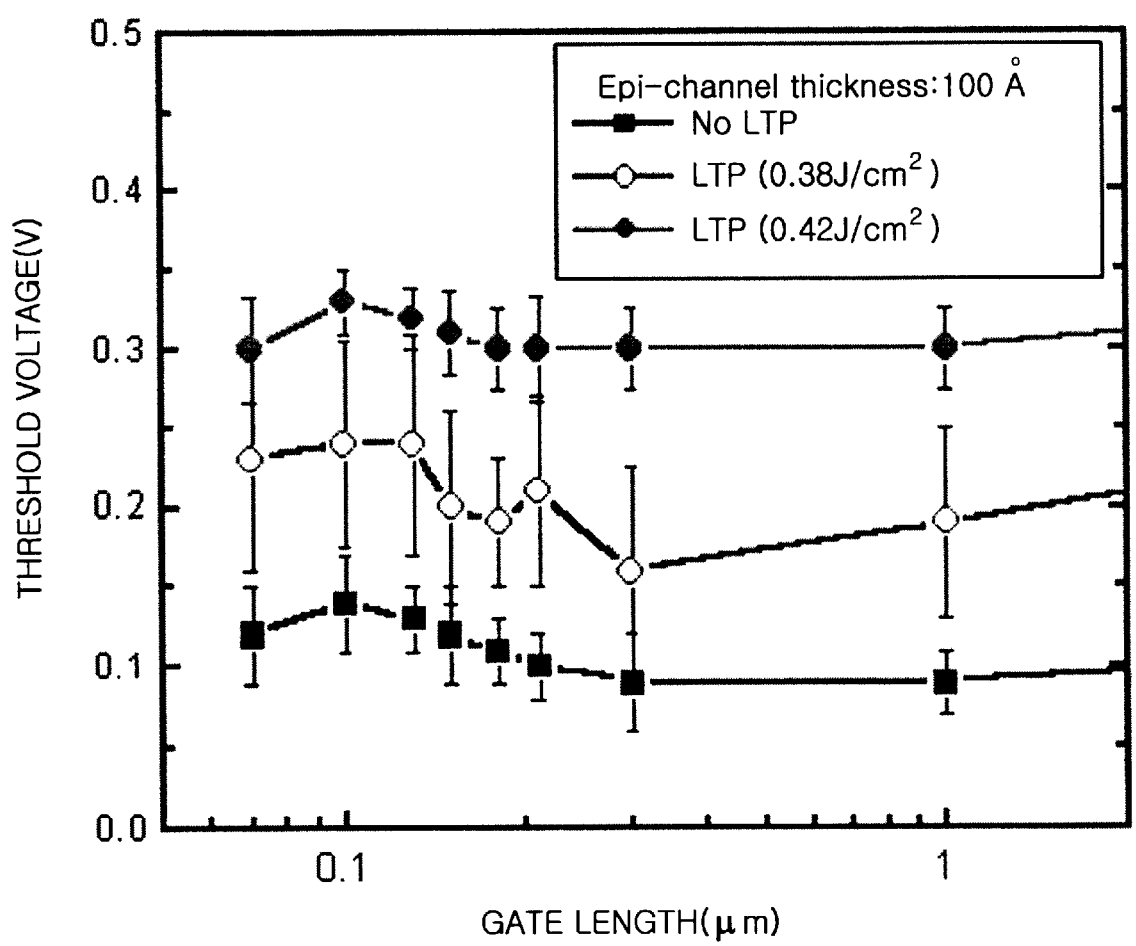
FIG. 4 is a plot showing threshold voltage and a variation of the threshold voltage in a 0.70 μm-nMOS.

FIG. 4 is a plot showing threshold voltage and a variation of the threshold voltage in a 0.70 μm-nMOS. As shown in FIG. 4, if the LTP is not carried out, the low threshold voltage in the epitaxial channel region is caused by the loss of the boron ions. In the case of the LTP with a power of 0.38 J/cm², although the absolute value of the threshold voltage increases, the variation of the threshold voltage between the chips in a wafer increases because the boron ions are lost at the following RTP (rapid thermal processing) due to the weak strength of the laser treatment. In the case of the LTP with a sufficient power of 0.42 J/cm², the variation of the threshold voltage decreases with a high threshold voltage because the loss of the boron ions is restrained at the time of the following thermal processes.

As apparent from the above, the disclosed method improves current drivability of the semiconductor device by increase the ion activity to adjust the threshold voltage through the laser thermal treatment. Furthermore, the disclosed method maximizes the delta doping effect through the low energy ion-implantation.

Although the preferred embodiments of the disclosed method have been disclosed for illustrative purpose, those skilled in the art will appreciate that various modifications, additions and substitutes are possible, without departing from the scope and spirit of the present invention as described in the accompanying claims.

What is claimed:

1. A method for forming a semiconductor device comprising the steps of:
    forming a doping layer having impurity ions on a semiconductor substrate with a low energy ion-implantation;
    activating the impurity ions within the doping layer by thermally treating a surface of the semiconductor substrate with a laser;
    forming a channel epitaxial layer on the semiconductor substrate;
    forming a gate insulation layer on the channel epitaxial layer;
    forming a gate electrode on the gate insulation layer; and
    forming a source/drain region in the semiconductor substrate.

2. The method as recited in claim 1, wherein the doping layer is formed by implanting boron ions into the semiconductor substrate and wherein the boron ions have a dose ranging from about $1 \times 10^{12}$ to about $5 \times 10^{13}$ atms/cm² at a voltage ranging from about 0.1 to about 5 keV.

3. The method as recited in claim 1, wherein the doping layer is formed by implanting $BF_2$ ions into the semiconductor substrate and wherein the $BF_2$ ions have a dose ranging from about $1 \times 10^{12}$ to about $5 \times 10^{13}$ atms/cm² at a voltage rate ranging from about 0.5 to about 25 keV.

4. The method as recited in claim 1, wherein the laser is a 308 nm-XeCl laser and the laser has a power ranging from about 0.1 to about 2 J/cm².

5. The method as recited in claim 1, further comprising the step of making the surface of the semiconductor substrate amorphous by implanting silicon ions into the semiconductor substrate.

6. The method as recited in claim 1, further comprising the step of melting the surface of the semiconductor substrate by controlling a power of the laser.

7. The method as recited in claim 1, wherein the channel epitaxial layer is formed by LPCVD (Low Pressure Chemical Vapor Deposition) or UHV CVD (Ultra High Vacuum Chemical Vapor Deposition).

8. The method as recited in claim 7, wherein the LPCVD comprises the step of applying a hydrogen hardening to the semiconductor substrate for a time period ranging from about 1 minute to about 5 minutes at a temperature ranging from about 800° C. to about 900° C.

9. The method as recited in claim 8, wherein the channel epitaxial layer is formed by a gas mixture of dichlorosilane having a flow rate ranging from about 30 sccm to about 300 sccm and HCl having a flow rate ranging from about 30 sccm to about 200 sccm in a processing chamber for a time period ranging from about 3 minutes to about 10 minutes at a pressure ranging from about 10 torr to about 100 torr and at a temperature ranging from about 750° C. to about 950° C.

10. The method as recited in claim 7, wherein the channel epitaxial layer is formed by UHV CVD which forms the epitaxial silicon layer using silane or disilane at a pressure ranging from about 0.01 torr to about 1 torr and a temperature ranging from about 600° C. to about 700° C.

11. A semiconductor device formed using the method of claim 1.

12. A semiconductor device formed using the method of claim 2.

13. A semiconductor device formed using the method of claim 3.

14. A semiconductor device formed using the method of claim 4.

15. A semiconductor device formed using the method of claim 5.

16. A semiconductor device formed using the method of claim 6.

17. A semiconductor device formed using the method of claim 7.

18. A semiconductor device formed using the method of claim 8.

19. A semiconductor device formed using the method of claim 9.

20. A semiconductor device formed using the method of claim 10.

* * * * *